US011658375B2

(12) United States Patent
Ito

(10) Patent No.: US 11,658,375 B2
(45) Date of Patent: May 23, 2023

(54) ELECTROMAGNETIC BAND GAP STRUCTURE AND PACKAGE STRUCTURE

(71) Applicant: NEC Corporation, Tokyo (JP)

(72) Inventor: Masaharu Ito, Tokyo (JP)

(73) Assignee: NEC CORPORATION, Tokyo (JP)

( * ) Notice: Subject to any disclaimer, the term of this patent is extended or adjusted under 35 U.S.C. 154(b) by 125 days.

(21) Appl. No.: 17/426,118

(22) PCT Filed: Dec. 13, 2019

(86) PCT No.: PCT/JP2019/048951
§ 371 (c)(1),
(2) Date: Jul. 28, 2021

(87) PCT Pub. No.: WO2020/158213
PCT Pub. Date: Aug. 6, 2020

(65) Prior Publication Data
US 2022/0166121 A1   May 26, 2022

(30) Foreign Application Priority Data
Jan. 29, 2019 (JP) .............................. JP2019-013160

(51) Int. Cl.
*H01P 1/20* (2006.01)
*H01P 3/08* (2006.01)
(Continued)

(52) U.S. Cl.
CPC ............ *H01P 3/082* (2013.01); *H01P 1/2005* (2013.01); *H01P 7/082* (2013.01); *H05K 1/0236* (2013.01)

(58) Field of Classification Search
CPC ........ H01P 1/2005; H01P 3/082; H01P 7/082; H05K 1/0236; H05K 1/0237; H01Q 15/006; H01Q 15/008
See application file for complete search history.

(56) References Cited

U.S. PATENT DOCUMENTS

2016/0134253 A1* 5/2016 Li .......................... H01P 7/065
                                                        333/209
2016/0141748 A1   5/2016 Tagi et al.
(Continued)

FOREIGN PATENT DOCUMENTS

| JP | 2016105583 A | 6/2016 |
| JP | 2016105584 A | 6/2016 |
| JP | 2018164149 A | 10/2018 |

OTHER PUBLICATIONS

International Search Report for PCT Application No. PCT/JP2019/048951, dated Feb. 25, 2020.
(Continued)

*Primary Examiner* — Stephen E. Jones
(74) *Attorney, Agent, or Firm* — Sughrue Mion, PLLC

(57) ABSTRACT

An electromagnetic bandgap structure includes a plurality of resonators. Each of the resonators includes a dielectric substrate, a patch conductor formed on an upper surface of the dielectric substrate, and a conductor layer formed on a lower surface of the dielectric substrate. The patch conductor and the conductor layer are electrically connected to each other by via holes penetrating the dielectric substrate. A plurality of long holes and are formed on the lower surface of the dielectric substrate. A long hole conductor layer is formed on an inner wall surface of the long holes and. The conductor layer and the long hole conductor layer are electrically connected to each other to thereby form an integral conductor surface. The via holes are electrically connected to the conductor surface in the long holes and.

10 Claims, 16 Drawing Sheets

(51) Int. Cl.
*H01P 7/08* (2006.01)
*H05K 1/02* (2006.01)

(56) References Cited

U.S. PATENT DOCUMENTS

2016/0141749 A1  5/2016  Tagi et al.
2018/0277946 A1  9/2018  Murata et al.

OTHER PUBLICATIONS

Naobumi Michishita, "Electromagnetic Band Gap Structure for Suppressing Radio Wave", IEICE Communications Society Magazine, Dec. 1, 2010, No. 15, pp. 18-24.

* cited by examiner

ELECTROMAGNETIC BAND GAP STRUCTURE AND PACKAGE STRUCTURE

This application is a National Stage Entry of PCT/JP2019/048951 filed on Dec. 13, 2019, which claims priority from Japanese Patent Application 2019-013160 filed on Jan. 29, 2019, the contents of all of which are incorporated herein by reference, in their entirety.

TECHNICAL FIELD

The present disclosure relates to an electromagnetic band gap structure and a package structure.

BACKGROUND ART

Recently, communication traffic has increased rapidly due to the expansion of large-capacity communication such as streaming video in addition to the increase in the number of terminals because of the spread of mobile terminal devices such as smartphones. Under such circumstances, it is expected to achieve large-capacity communication using the sub-terahertz band (commonly 100 GHz or higher) having a wide frequency band.

In a high frequency band module such as a millimeter wave band according to related art, LTCC (Low Temperature Co-fired Ceramics), which is easy to be multilayered and has a high degree of freedom in design, is widely used. Resin substrates are often used, because the loss of the material is inherently low and transmission loss of the resin substrate is also low because of a low dielectric constant (reduction of wavelength shortening effect). The resin substrate is, for example, PTFE (PolyTetraFluoroEthylene), LCP (Liquid Crystal Polymer), or the like.

Since the wavelength is very small in the sub-terahertz band, higher processing accuracy is required for a transmission line or the like of a high-frequency signal. Further, there is no room in gain performance of a semiconductor element such as an amplifier, and thus it is important to transmit a high frequency signal more efficiently. Thus, it is desirable that the loss of materials used for the package is low. Since the dimensional accuracy of LTCC, which is commonly used in the millimeter wave band, is not very high and the loss thereof is relatively large, it is difficult to employ LTCC in the sub-terahertz band. On the other hand, although the loss of the resin substrate is low, the resin substrate has low rigidity, the methods of mounting the resin substrate are limited, and its dimensional accuracy is not very high, which makes it difficult to employ the resin substrate in the sub-terahertz band, like the LTCC.

There is a quartz glass as a substrate material having high rigidity, easy to achieve high dimensional accuracy, low loss, and low dielectric constant. However, since the formation of via holes in the quartz glass is difficult, the use of the via holes has been limited, and thus the via holes have not been widely used. Recently, the progress of the technique for forming via holes has enabled fine via holes to be formed with high accuracy, which results in an increase in the use of quartz for millimeter wave band packages.

In a high frequency band module, for example, it is necessary to ensure isolation between transmitting antennas and receiving antennas formed on a package and between transmitter ICs and receiver ICs mounted on a package in order to prevent or reduce deterioration of high frequency characteristics.

As a structure for ensuring isolation, Non Patent Literature 1 discloses an Electro-magnetic Band Gap (EBG) structure 1 shown in FIG. 7 of the present application.

In the EBG structure 1, a large number of mushroom type resonators 2 are periodically formed on a plane. A pitch in the X direction as the horizontal direction is indicated by a pitch $L_X$, and the pitch in the Y direction as the vertical direction is indicated by a pitch $L_Y$. The plurality of resonators 2 are arranged in a cycle of the pitch $L_X$ in the X direction and in a cycle of the pitch $L_Y$ in the Y direction.

The resonator 2 is composed of conductor layers 4 formed on a lower surface and an upper surface of a dielectric substrate 3, a rectangular patch conductor 5 electrically isolated from surrounding conductor layers, and a via hole 6 electrically connecting the conductor layer 4 to the patch conductor 5.

An upper surface of the EBG structure 1 becomes a high impedance in the vicinity of the resonance frequency of the resonator 2. As a result, since the surface waves cannot propagate on the upper surface of the EBG structure 1, isolation between two points separated by the EBG structure 1 can be ensured. The resonance frequency of the resonator 2 is approximately a frequency at which a capacitance between the patch conductor 5 and the conductor layer 4 and an inductance of the via hole 6 resonate in parallel. Here, the capacitance is approximately proportional to an area $L^2$ of the patch conductor 5, and the inductance is approximately proportional to the length of the via hole 6 corresponding to a thickness $T_0$ of the dielectric substrate 3.

The pitches $L_X$ and $L_Y$ of the resonators 2 are desirably ½ or less of a wavelength of the surface wave in the structure composed of at least the dielectric substrate 3 and the conductor layer 4 in order to prevent the formation of another resonator structure between two adjacent resonators.

CITATION LIST

Non Patent Literature

Non Patent Literature 1: Institute of Electronics, Information and Communication Engineers Society Magazine, Winter issue 2010, No. 15, pp 18-24

SUMMARY OF INVENTION

Technical Problem

In order for the via hole 6 to operate as an inductance, the length $T_0$ of the via hole 6 needs to be ¼ or less of the wavelength of an electromagnetic wave in the dielectric substrate. As mentioned above, LTCC, PTFE, and LCP can be easily multilayered. Therefore, even if a desired thickness (the length of the via hole) of the dielectric substrate is very small when LTCC, PTFE, and LCP are applied to the sub-terahertz band, the thickness of the entire substrate can be increased by laminating another dielectric substrate thereunder. That is, the strength of the entire substrate can be secured.

On the other hand, when a quartz glass is used, which is expected to be used in the sub-terahertz band, for example, ¼ of the wavelength of electromagnetic waves at 150 GHz is 0.26 mm (relative permittivity 3.8), which is very small. Since a quartz glass substrate is rigid and easily cracked and thus difficult to be multilayered, a desired thickness of a quartz substrate becomes very small, and therefore ensuring the strength of the substrate has been a problem.

An object of the present disclosure is to provide an electromagnetic bandgap structure that solves any of the foregoing problems.

Solution to Problem

According to an example aspect of the present disclosure, an electromagnetic bandgap structure comprising a plurality of resonators is provided. The resonator includes a first dielectric substrate, a patch conductor formed on an upper surface of the first dielectric substrate, and a first conductor layer formed on a lower surface of the first dielectric substrate. The resonator is configured in such a way that the patch conductor and the first conductor layer are electrically connected to each other by via holes penetrating the first dielectric substrate. A plurality of long holes not penetrating the first dielectric substrate are formed on the lower surface of the first dielectric substrate. A long hole conductor layer is formed on an inner wall surface of the plurality of long holes. The first conductor layer and the long hole conductor layer are electrically connected to each other to thereby form an integral conductor surface. The via holes are electrically connected to the conductor surface in the long holes.

Advantageous Effects of Invention

According to the present disclosure, in an electromagnetic bandgap structure composed of mushroom type resonators, the following effects are exhibited. That is, by forming a local groove structure in the dielectric substrate, it is possible to ensure isolation up to a high frequency band while ensuring mechanical strength of a substrate without thinning a entire dielectric substrate.

DESCRIPTION OF EMBODIMENTS

First Example Embodiment

Figure 1A:
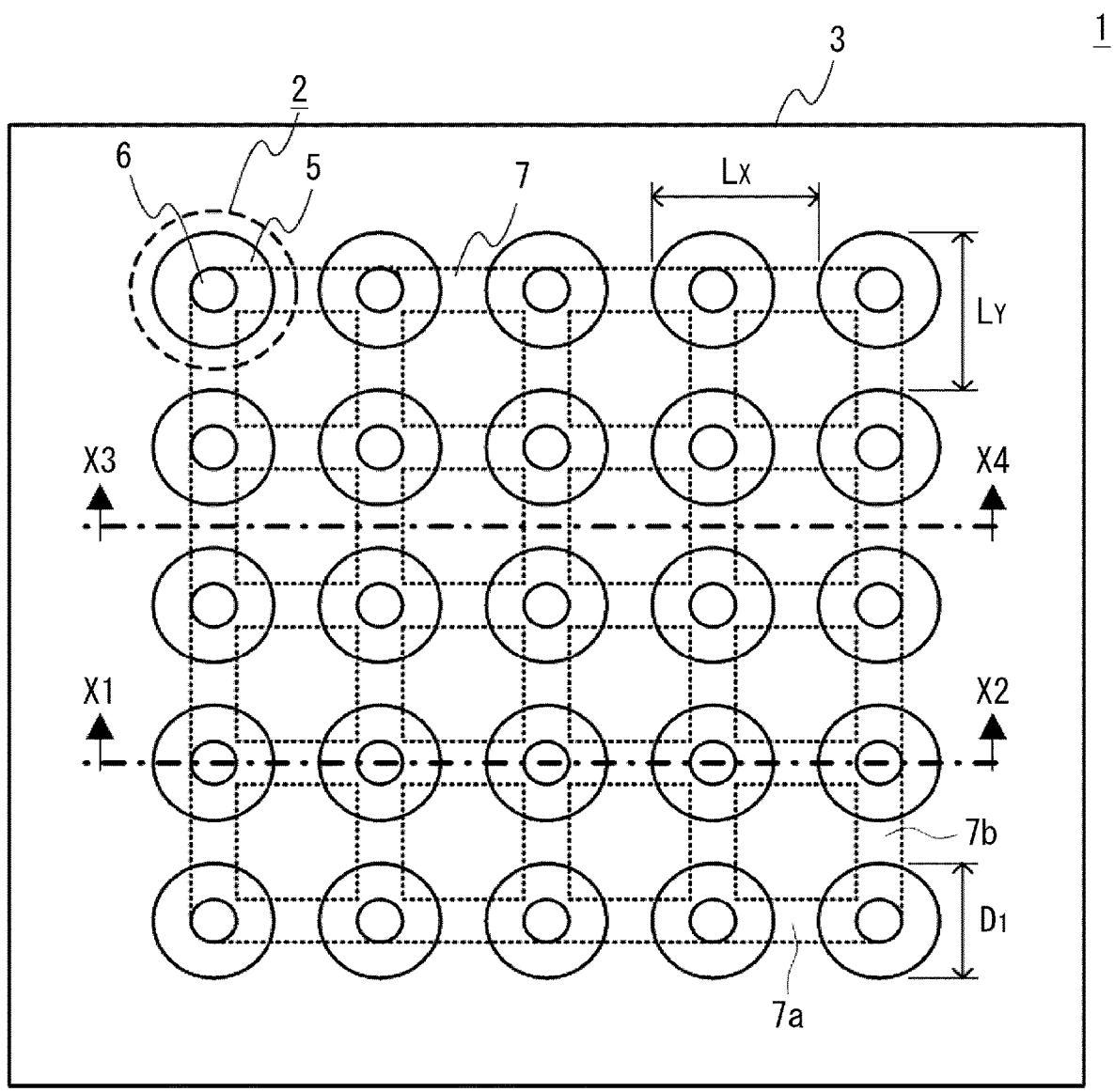
FIG. 1A is a plan view of an EBG structure (first example embodiment)
Figure 1B:
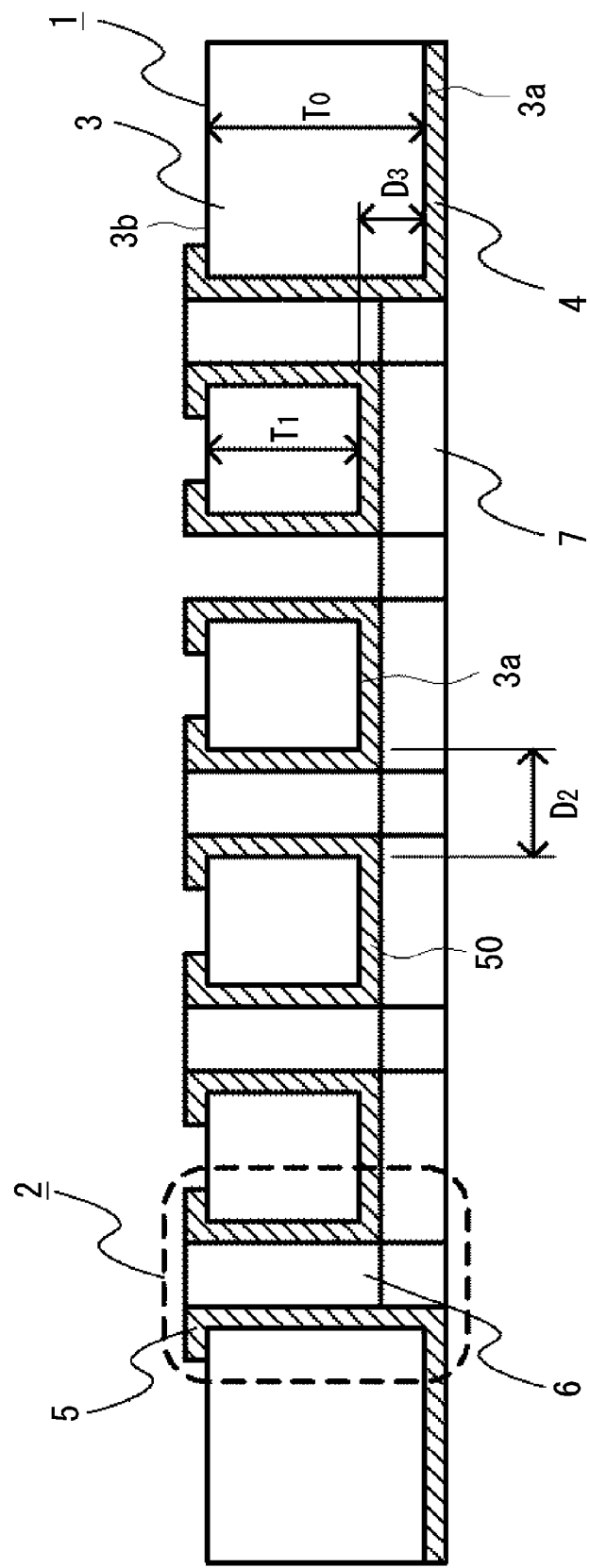
FIG. 1B is a cross-sectional view taken along the line X1-X2 of FIG. 1A (first example embodiment)
Figure 1C:
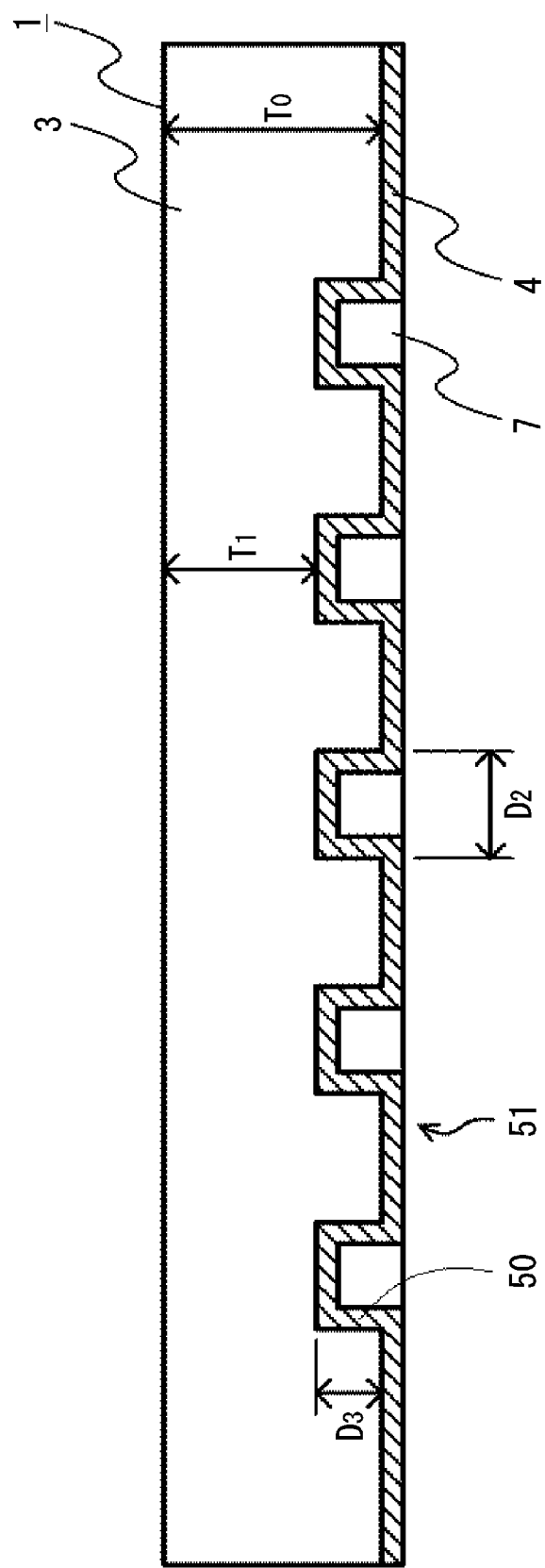
FIG. 1C is a cross-sectional view taken along the line X3-X4 of FIG. 1A (first example embodiment)

A first example embodiment will be described below with reference to FIGS. 1A to 1C. FIG. 1A is a plan view of an EBG structure 1. FIG. 1B is a cross-sectional view taken along the line X1-X2 of FIG. 1A. FIG. 1C is a cross-sectional view taken along the line X3-X4 of FIG. 1A.

The EBG structure 1 as an electromagnetic band gap structure includes a plurality of resonators 2. All of the plurality of resonators 2 are mushroom type. The plurality of resonators 2 are arranged in a matrix in a plan view of the EBG structure 1. That is, the plurality of resonators 2 are periodically arranged on a plane so as to have a predetermined pitch in the X direction and a predetermined pitch in the Y direction. The pitch in the X direction of the plurality of resonators 2 is indicated by a pitch $L_X$, and the pitch in the Y direction is indicated by a pitch $L_Y$.

Each resonator 2 is composed of a dielectric substrate 3 (a first dielectric substrate) made of a quartz glass, a conductor layer 4 (a first conductor layer) formed on a lower surface 3a of the dielectric substrate 3, a patch conductor 5 formed on an upper surface 3b of the dielectric substrate 3, and a via hole 6. The via hole 6 electrically connects the conductor layer 4 to the patch conductor 5. The via hole 6 extends along the thickness direction of the dielectric substrate 3 and penetrate the dielectric substrate 3. The via hole 6 extends from the conductor layer 4 formed on the lower surface 3a of the dielectric substrate 3 to the patch conductor 5 formed on the upper surface 3b of the dielectric substrate 3. The patch conductor 5 is circular in the plan view, and an outer diameter thereof is indicated by a diameter $D_1$. An outer diameter of the via hole 6 is indicated by a diameter $D_2$.

The pitch $L_X$ and the pitch $L_Y$ are preferably ½ or less of the wavelength of the surface wave propagating in the structure composed of at least the dielectric substrate 3 and the conductor layer 4 so that another resonator structure will not be formed between the two adjacent resonators 2.

A resonance frequency of the resonator 2 is approximately determined by a parallel resonance of a capacitance between the patch conductor 5 and the conductor layer 4 and an inductance of the via hole 6, and the resonance frequency of the resonator 2 decreases as the capacitance between the patch conductor 5 and the conductor layer 4 increases. Therefore, in order to make a thickness $T_0$ of the dielectric substrate 3 as large as possible while obtaining a desired resonance frequency, it is desirable to make the capacitance between the patch conductor 5 and the conductor layer 4 as small as possible, namely, to make the area of the patch conductor 5 as small as possible in the plan view. In a common manufacturing process of the via hole 6, the patch conductor 5 is required as a land conductor for receiving the via holes 6. The shape of the patch conductor 5 in the plan view is not limited. In order to make the resonance frequency as high as possible, the shape of the patch conductor 5 in the plan view is preferably a circular shape which is convenient for minimizing the area of the patch conductor 5 in the plan view.

A groove structure 7 is formed on the lower surface 3a of the dielectric substrate 3. The groove structure 7 is formed by engraving the lower surface 3a of the dielectric substrate 3 in a lattice shape. The groove structure 7 is formed by partially recessing the lower surface 3a of the dielectric substrate 3, and is a lattice-like recess in a bottom view.

The groove structure 7 is composed of a plurality of long holes 7a and a plurality of long holes 7b. The plurality of long holes 7a and the plurality of long holes 7b are formed on the lower surface 3a of the dielectric substrate 3. Each of the plurality of long holes 7a and the plurality of long holes 7b is a recess formed on the lower surface 3a of the dielectric substrate 3 and does not penetrate the dielectric substrate 3. The plurality of long holes 7a and the plurality of long holes 7b are formed so as to cross each other into a lattice shape. The plurality of long holes 7a are recesses extending in the X direction. The plurality of long holes 7b are recesses extending in the Y direction. The plurality of long holes 7a are arranged at the pitch $L_Y$ in the Y direction. The plurality of long holes 7b are arranged at the pitch $L_X$ in the X direction. In the plan view shown in FIG. 1, the plurality of long holes 7a and the plurality of long holes 7b intersect with each other in an area where they overlap with the via holes 6 of the plurality of resonators 2. That is, in the plan view shown in FIG. 1, each of the plurality of long holes 7a and the plurality of long holes 7b intersects with one of the via holes 6.

A long hole conductor layer 50 is formed on an inner wall surface of the groove structure 7 by plating or the like. The long hole conductor layer 50 and the conductor layer 4 defining the groove structure 7 are electrically connected to each other. That is, the long hole conductor layer 50 and the conductor layer 4 defining the groove structure 7 constitute one conductor surface 51. The via hole 6 of each resonator 2 is electrically connected to the conductor surface 51 at a position where the via hole 6 intersects with any of the plurality of long holes 7a and the plurality of long holes 7b in the plan view shown in FIG. 1.

In FIG. 1B, a depth of the groove structure 7 is indicated by a depth $D_3$. By forming the groove structure 7 on the lower surface 3a of the dielectric substrate 3, the following effects are exhibited. That is, the effective thickness of the dielectric substrate 3 in the vicinity of the via hole 6 which dominantly contributes to the inductance of the via hole 6 can be locally reduced without reducing the entire thickness $T_0$ of the dielectric substrate 3. The effective thickness of the dielectric substrate 3 depends on the diameter $D_2$, the pitch $L_X$, and the pitch $L_Y$ of the via hole 6, and is a size between $T_0$ and $T_1$ (=$T_0$–$D_3$). As a result, even if the thickness $T_0$ of the dielectric substrate 3 is increased, a desired resonance frequency can be obtained for the resonator 2.

The groove structure 7 is formed by combining the plurality of long holes 7a and the plurality of long holes 7b in a lattice shape. Therefore, for example, the strength of the dielectric substrate 3 can be ensured as compared with the case where the entire thickness of the dielectric substrate 3 is reduced.

Here, an example of a method for forming the groove structure on a quartz glass substrate is described. As described above, the groove structure is formed by forming a plurality of long holes in a lattice shape. Each of the long holes can be formed by forming a plurality of non-penetrating via holes which do not penetrate the quartz glass substrate at a pitch about a radius of the via hole in the X direction and the Y direction.

Next, an example of a method for forming the via hole is described. First, a central position of a via hole to be formed is irradiated with a femtosecond laser, and a focus of the femtosecond laser is scanned so as not to penetrate the quartz glass substrate, thereby partially modifying the quartz glass substrate. Next, the quartz glass substrate is subjected to hydrofluoric acid treatment. Then, the modified part of the quartz glass substrate is selectively etched quickly, and then the quartz glass substrate is etched isotropically and gently. By doing so, the non-penetrating via holes can be formed in the quartz glass substrate. As described above, since the plurality of via holes are arranged at a pitch equal to the radius of the via hole in the X and Y directions, adjacent via holes are connected to each other in the isotropic etching processing, thereby forming the plurality of long holes. Note that the penetrating via hole may be formed by scanning the focus so as to penetrate the quartz glass substrate.

Figure 8:
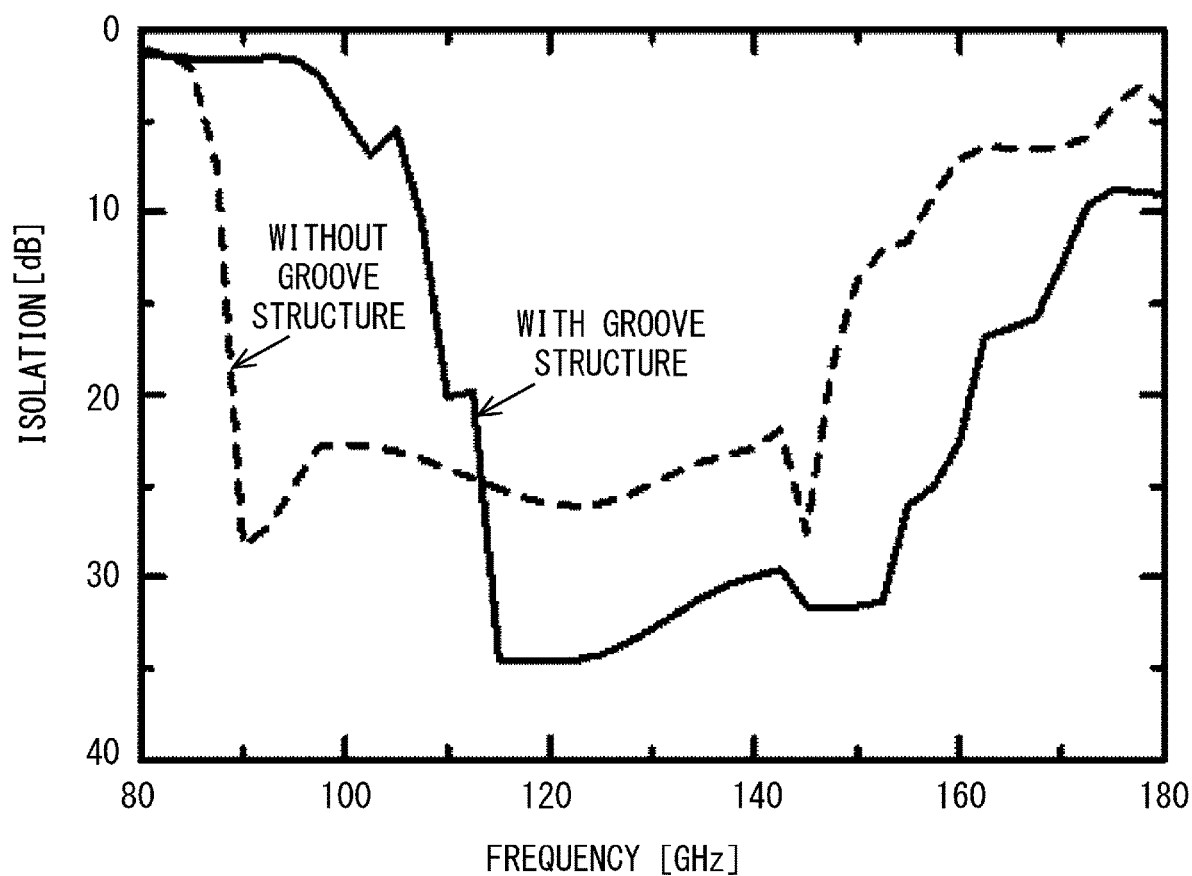
FIG. 8 is a graph of analysis results showing the effect of the groove structure according to the present disclosure on improving an upper frequency limit of isolation characteristics.

FIG. 8 shows a result of an electromagnetic field analysis of the isolation characteristics between two points separated by the EBG structure in the X direction when the groove structure according to the first example embodiment is formed on the dielectric substrate (indicated by "with groove structure" in the drawing) and when the groove structure is not formed (indicated by "without groove structure").

A quartz glass substrate was assumed as the dielectric substrate, and the thickness $T_0$ was set at 0.35 mm, at which sufficient strength was obtained in actual trial manufacture. The diameter $D_1$ of the patch conductor was 0.2 mm, the diameter $D_2$ of the via hole was 0.1 mm, the pitch $L_X$ of the resonator was 0.45 mm, the pitch $L_Y$ of the resonator was 0.45 mm, and the number of resonators in the X direction and the number of resonators in the Y direction were 5. The depth $D_3$ of the groove structure was 0.1 mm. According to FIG. 8, it has been confirmed that isolation can be ensured to a higher frequency by providing the groove structure on the lower surface of the dielectric substrate.

Second Example Embodiment

Figure 2A:
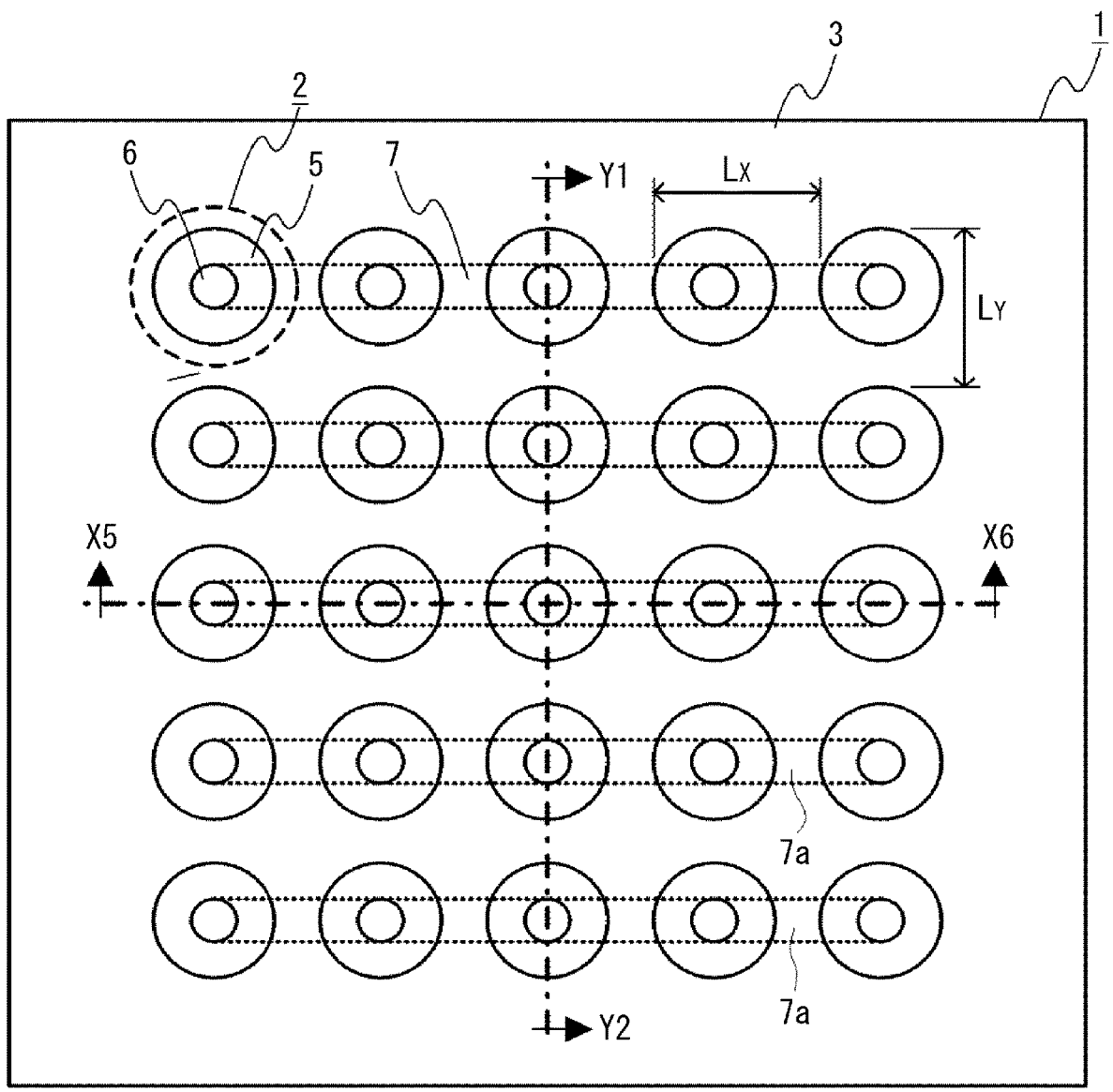
FIG. 2A is a plan view of an EBG structure (second example embodiment)
Figure 2B:
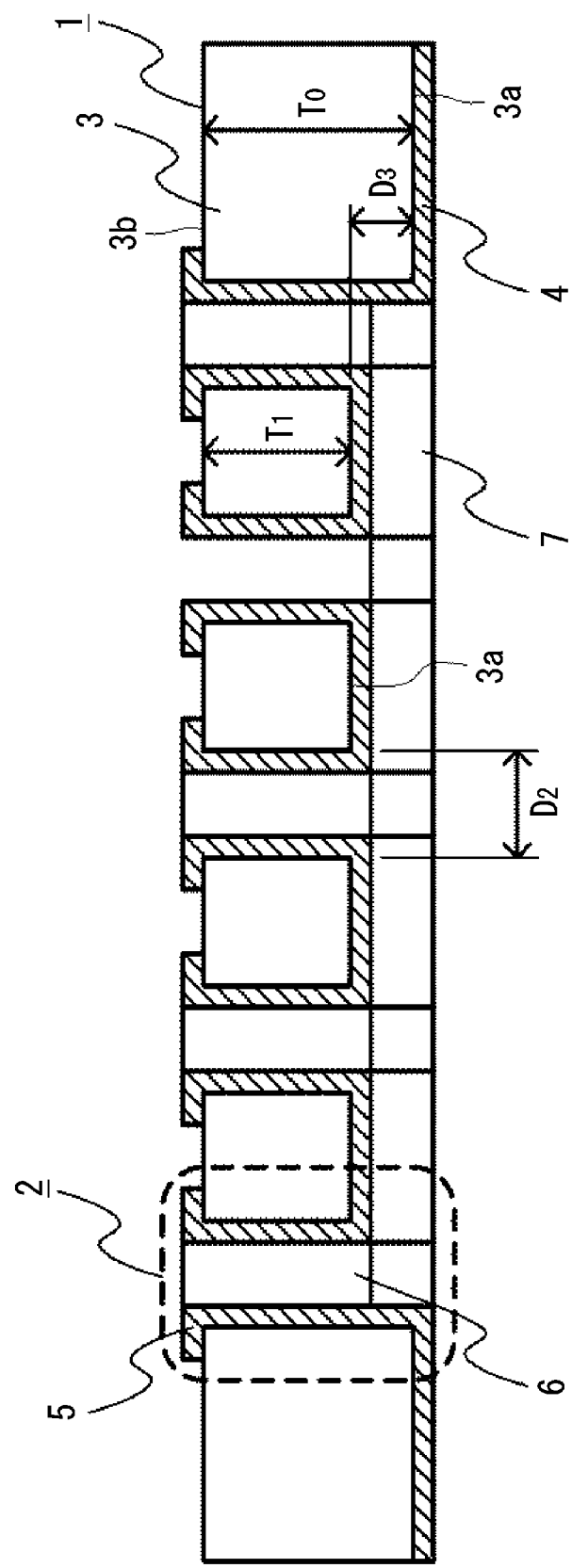
FIG. 2B is a cross-sectional view taken along the line X5-X6 of FIG. 2A (second example embodiment)
Figure 2C:
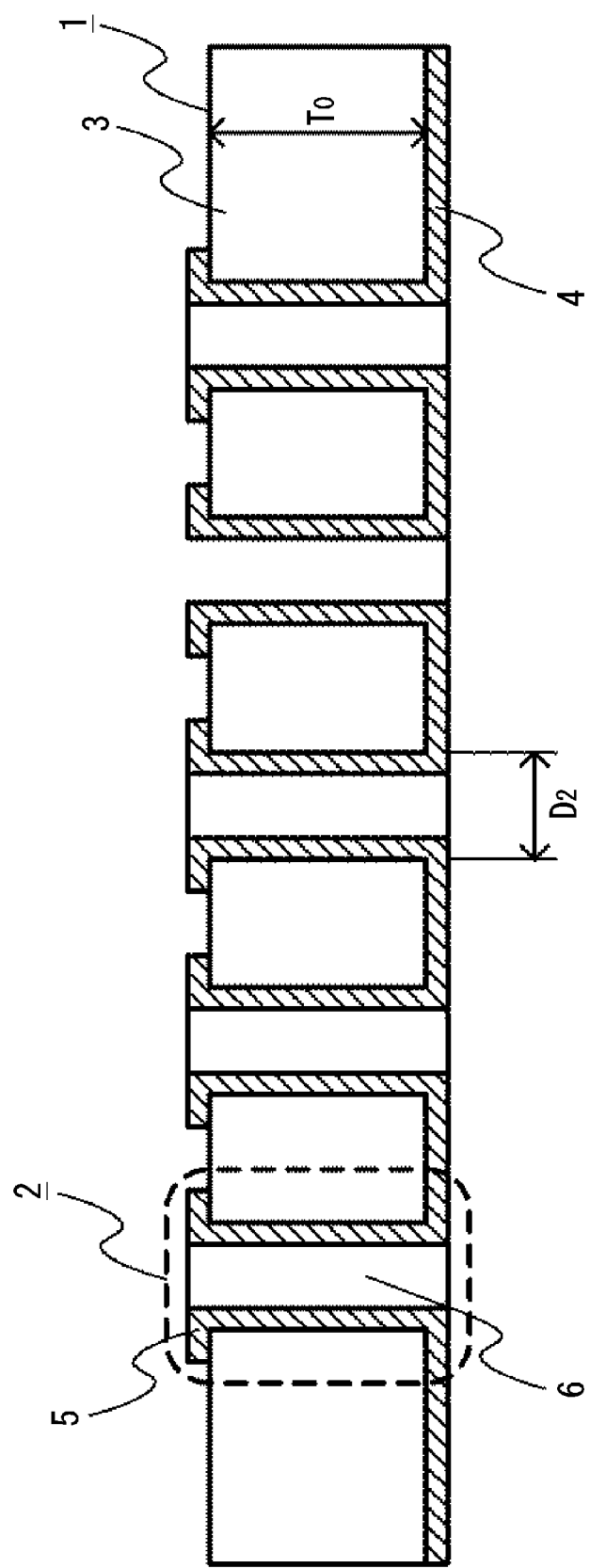
FIG. 2C is a cross-sectional view taken along the line Y1-Y2 of FIG. 2A (second example embodiment)

A second example embodiment will be described below with reference to FIGS. 2A to 2C. FIG. 2A is a plan view of an EBG structure. FIG. 2B is a cross-sectional view taken along the line X5-X6 of FIG. 2A. FIG. 2C is a cross-sectional view taken along the line Y1-Y2 of FIG. 2A.

In the first example embodiment, the EBG structure 1 includes a lattice-like groove structure 7 including the plurality of long holes 7a and the plurality of long holes 7b.

On the other hand, the EBG structure 1 according to this example embodiment includes the groove structure 7 including only the plurality of long holes 7a and not the plurality of long holes 7b. The plurality of long holes 7a extend in the same direction. The plurality of long holes 7a extend in the X direction. The plurality of long holes 7a are formed apart from each other in the Y direction.

According to the above configuration, the cross-sectional shape along the line X5-X6 in the X direction is the same as that of the first example embodiment. Therefore, the effective thickness of the dielectric substrate can be reduced with respect to the surface wave propagating in the X direction. That is, the resonance frequency of the resonator 2 can be increased. On the other hand, the cross-sectional shape along the line Y1-Y2 in the Y direction is the same as that in the case where there is no groove structure 7, and thus the effect of reducing the effective thickness of the dielectric substrate is small with respect to the surface wave propagating in the Y direction. However, since the area where the groove structure 7 is formed is reduced in the plan view, productivity and mechanical strength can be improved. Thus, this example embodiment is particularly suitable when it is sufficient to ensure only the isolation in the X direction in a desired frequency band.

Third Example Embodiment

Figure 3:
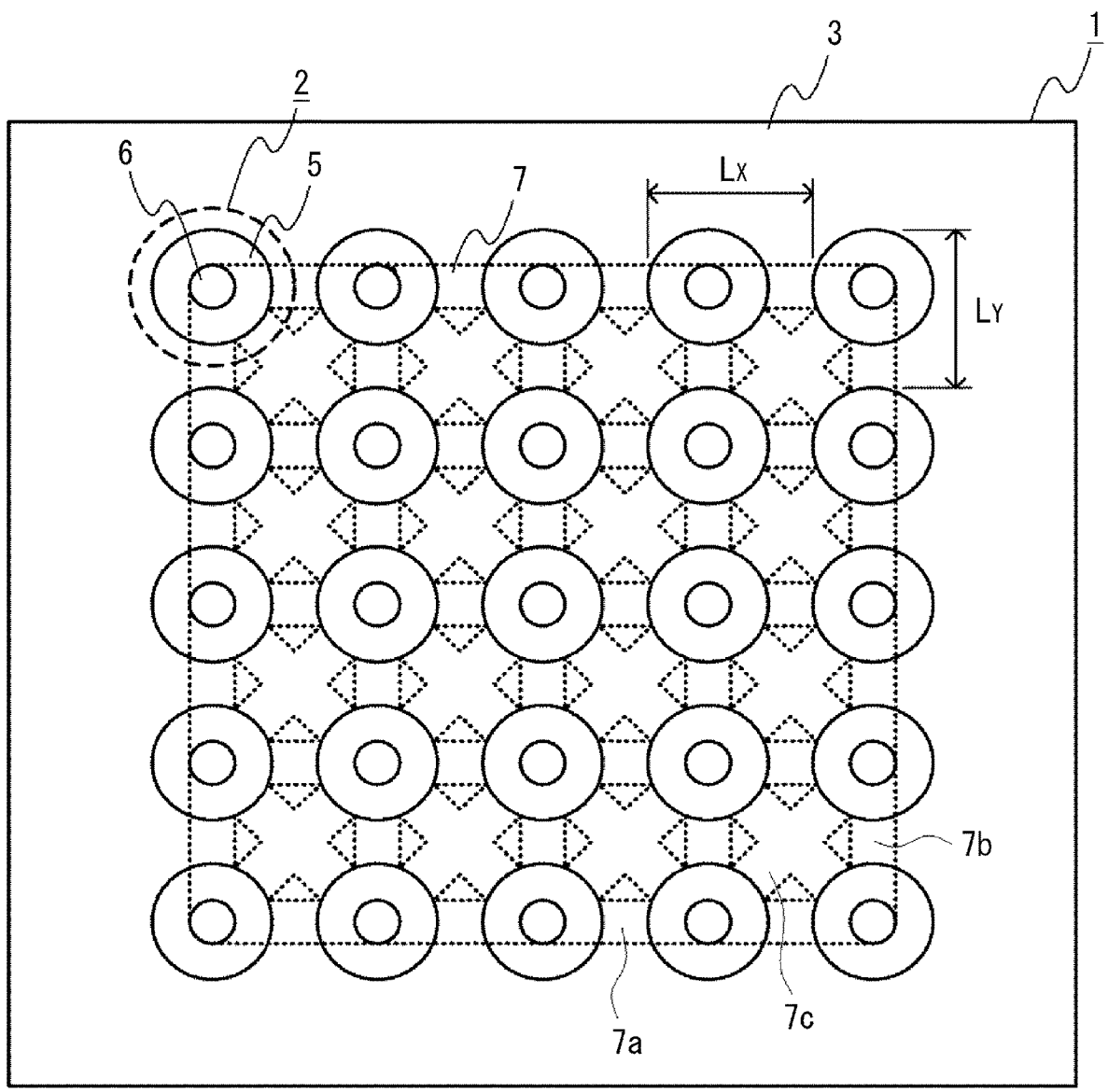
FIG. 3 is a plan view of an EBG structure (third example embodiment)

Next, a third example embodiment will be described with reference to FIG. 3. Hereinafter, this example embodiment will be described focusing on the differences between the third example embodiment and the first example embodiment, and repeated description will be omitted. FIG. 3 is a plan view of an EBG structure.

The groove structure 7 may include a plurality of long holes 7c extending obliquely in the X direction and the Y direction in the plan view in addition to the plurality of long holes 7a extending in the X direction and the plurality of long holes 7b extending in the Y direction. The plurality of long holes 7c may be arranged in a lattice shape like the groove structure 7 shown in the first example embodiment, or may be formed so as to be separated from each other and extend in the same direction like the groove structure 7 shown in the second example embodiment. As described above, in this example embodiment, since the groove structure 7 according to the first example embodiment further includes the plurality of long holes 7c, the effective thickness of the dielectric substrate 3 is reduced not only in the X direction and the Y direction but also with respect to the surface wave propagating in the direction oblique to the X and Y directions.

Fourth Example Embodiment

Figure 4:
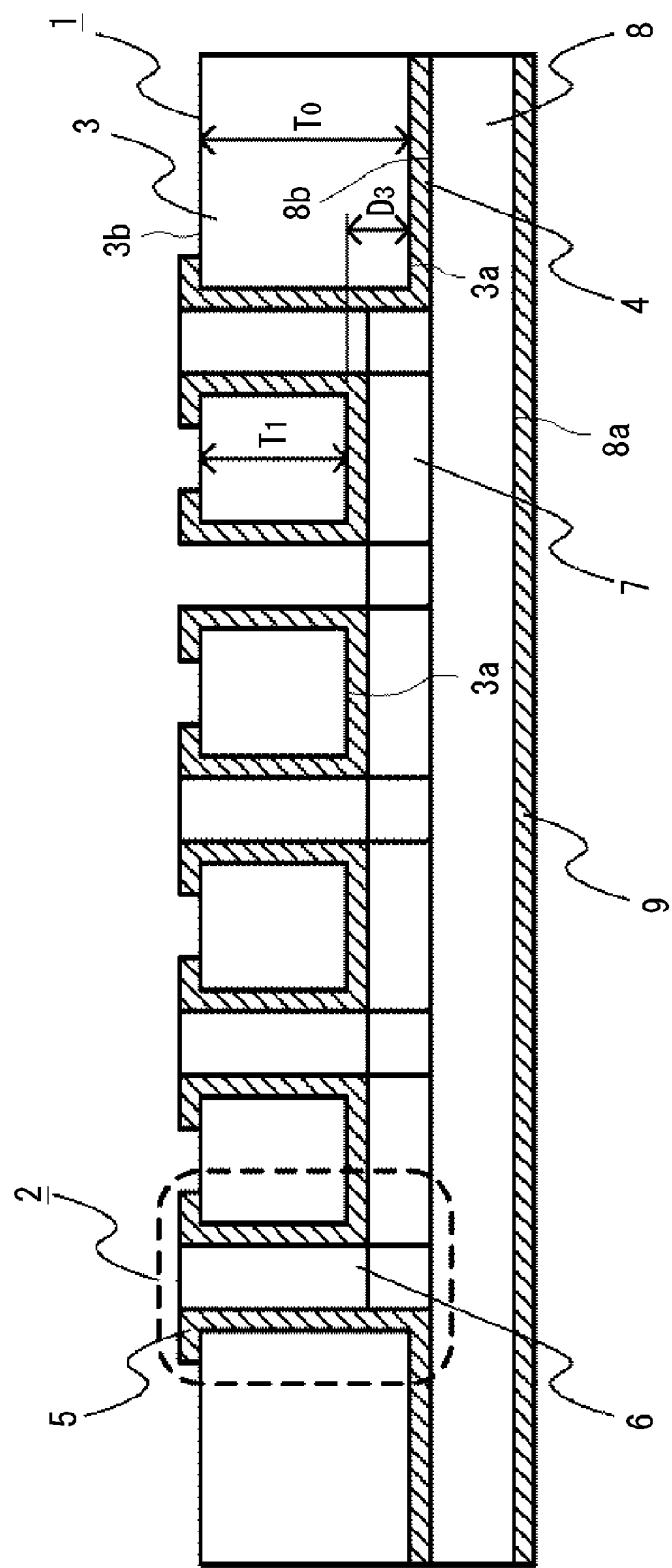
FIG. 4 corresponds to FIG. 1B (fourth example embodiment)

Next, a fourth example embodiment will be described with reference to FIG. 4. Hereinafter, this example embodiment will be described focusing on the differences between the fourth example embodiment and the first to third example embodiments, and repeated description will be omitted. FIG. 4 is a cross-sectional view corresponding to FIG. 1B.

The groove structure 7 according to the first to third example embodiments has a lattice shape or a shape including a plurality of long holes extending in the same direction apart from each other. Therefore, in the bottom view of the dielectric substrate 3, a part where the groove structure 7 is not formed is periodically present. For this reason, in the bottom view of the dielectric substrate 3, parts where the groove structure 7 is not formed partly remain.

In this example embodiment, a planar dielectric substrate 8 (a second dielectric substrate) is laminated on the lower surface 3a of the dielectric substrate 3. The dielectric substrate 8 is laminated on the lower side of the dielectric substrate 3. Therefore, the part of the dielectric substrate 3 where the groove structure 7 is not formed and the dielectric substrate 8 support each other, thereby improving the mechanical strength of the EBG structure 1.

A conductor layer 9 (a second conductor layer) is formed on a lower surface 8a of the dielectric substrate 8. Since the EBG structure 1 and the dielectric substrate 8 are electrically and completely separated by the conductor layer 4, a microstrip line can be formed using the conductor layer 4 and the conductor layer 9, or a coplanar line can be formed using the conductor layer 9. In addition, an electronic component and the like can be mounted on the EBG structure 1 using the conductor layer 9.

The material of the dielectric substrate 8 can be a quartz glass. However, since the quartz glass is rigid and fragile, if the material of the dielectric substrate 8 is a quartz glass, lamination of the dielectric substrate 8 becomes difficult. Therefore, as the material of the dielectric substrate 8, it is preferable to use a resin material having a low rigidity and a small load on the quartz glass substrate, such as polyimide. In this case, the dielectric substrate 8 made of a sheet-like resin material may be bonded to the conductor layer 4.

In this example embodiment, even if the dielectric substrate 8 itself is not rigid, since the dielectric substrate 8 and the dielectric substrate 3 periodically support each other, the deflection of the dielectric substrate 8 itself is prevented or reduced, and thereby easily ensuring the flatness of the conductor layer 9.

Another conductor layer may be formed on an upper surface 8b of the dielectric substrate 8, which faces the groove structure 7. In this case, structural continuity of the transmission line is secured even when the transmission line composed using the conductor layer 9 is formed over a part that does not face the groove structure and a part that faces the groove structure.

Fifth Example Embodiment

Figure 5A:
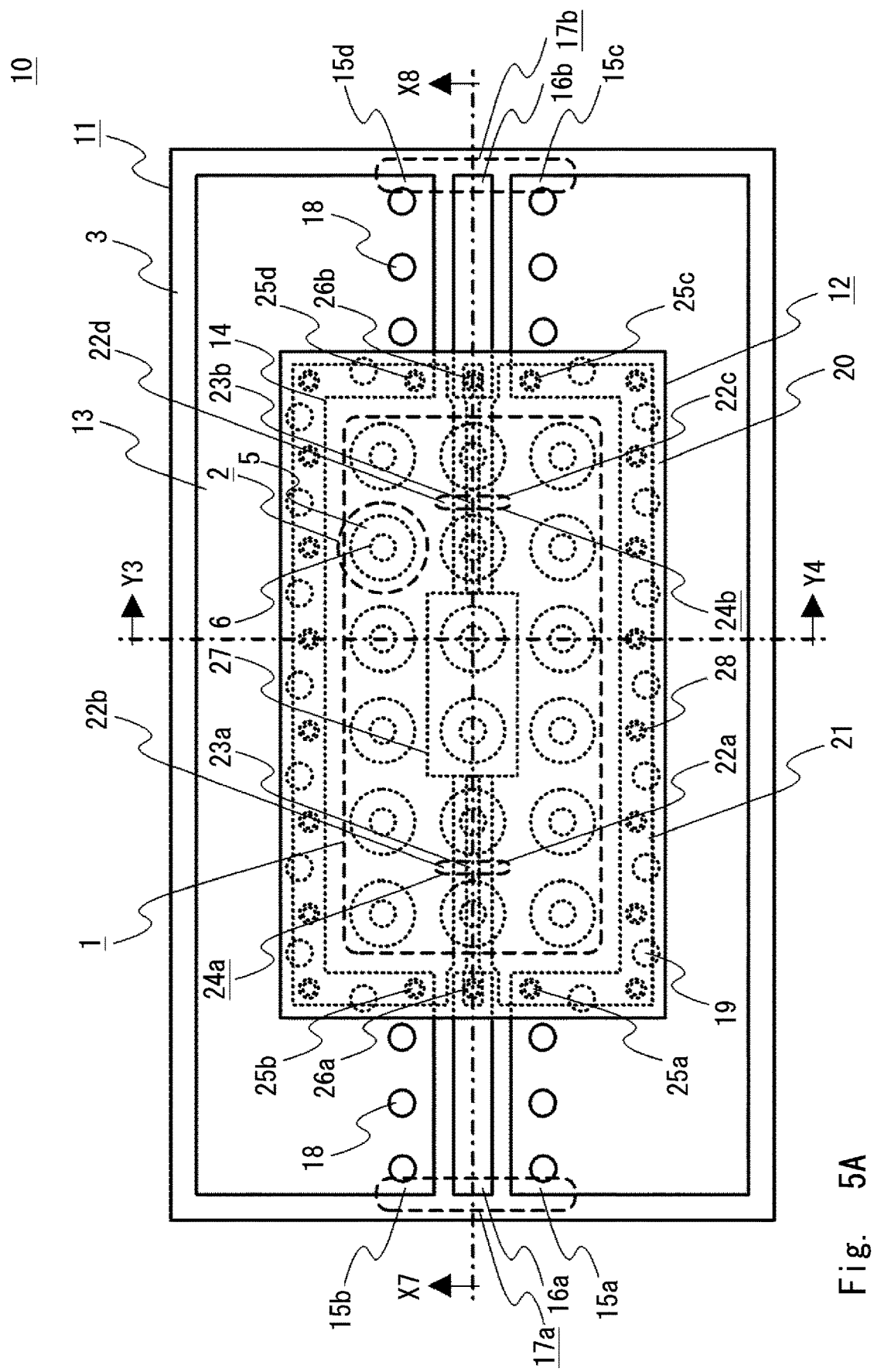
FIG. 5A is a plan view of a package structure including an EBG structure (fifth example embodiment)
Figure 5B:
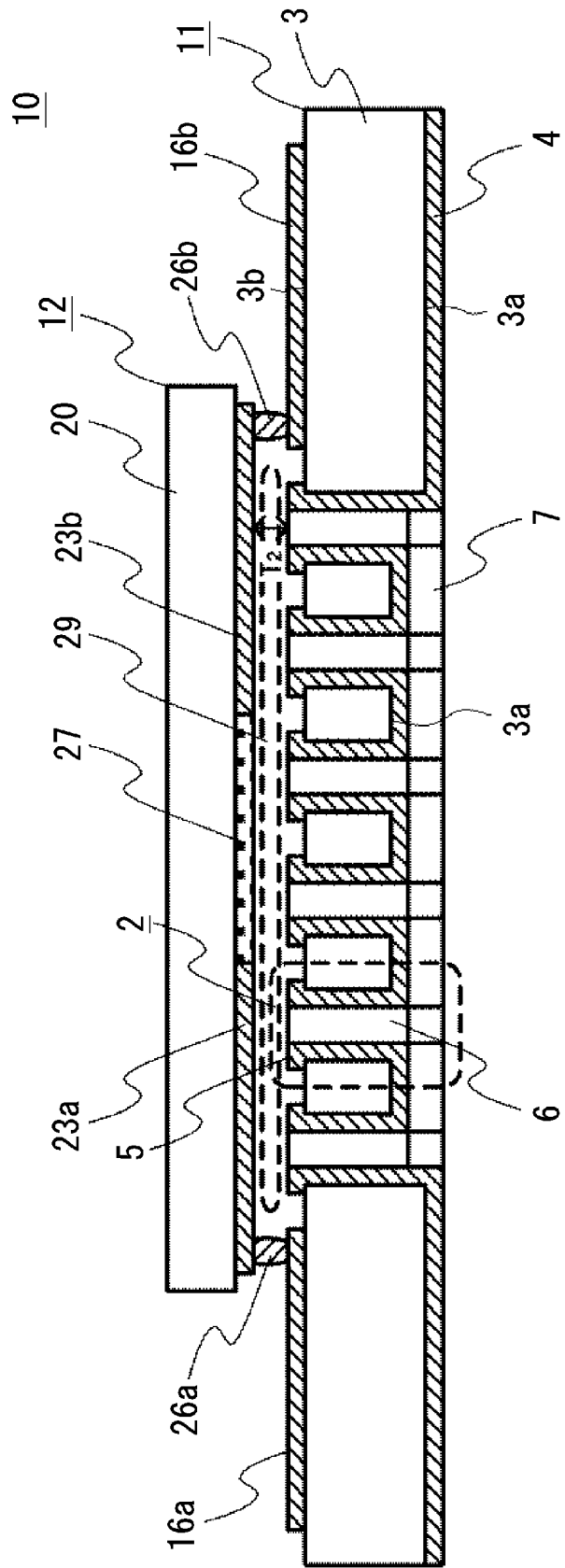
FIG. 5B is a cross-sectional view taken along the line X7-X8 of FIG. 5A (fifth example embodiment)
Figure 5C:
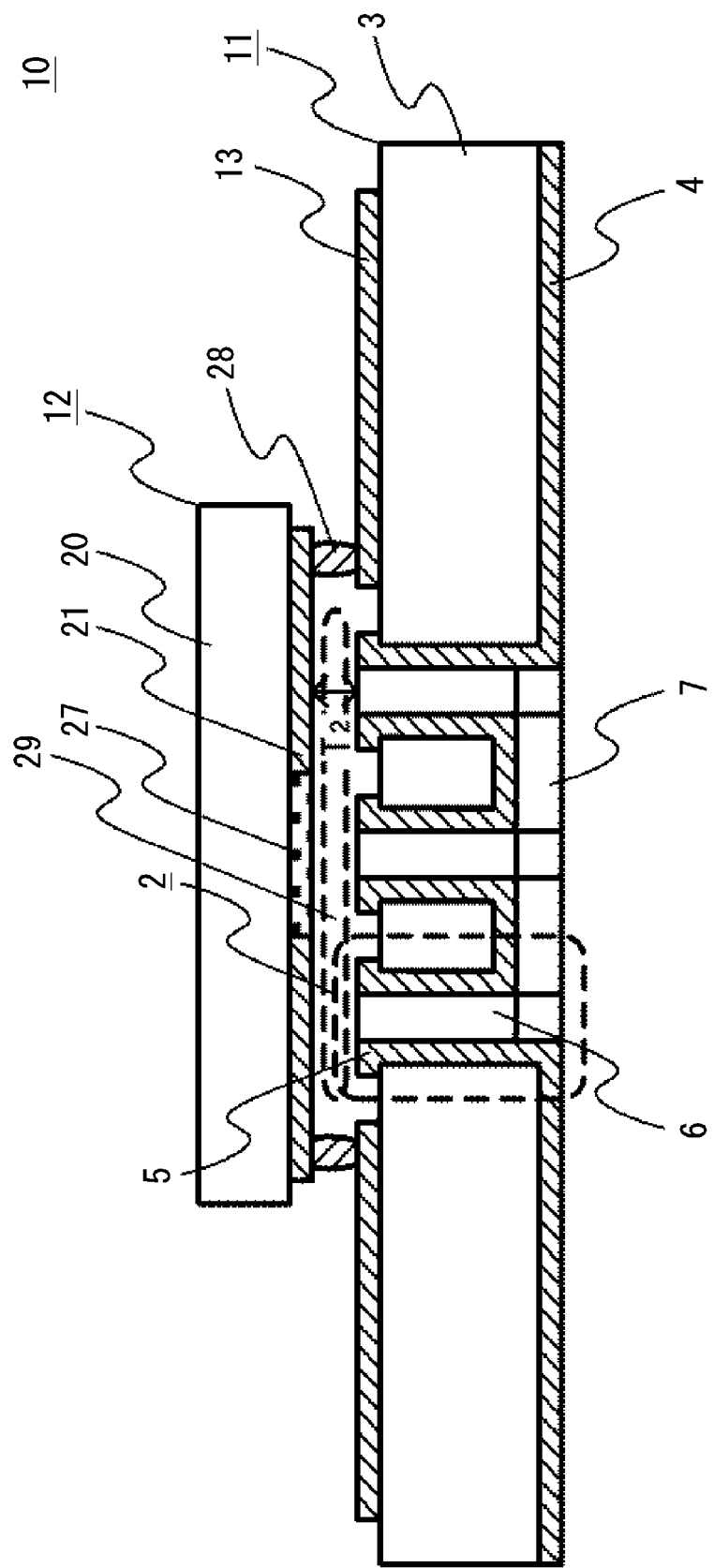
FIG. 5C is a cross-sectional view taken along the line Y3-Y4 of FIG. 5A (fifth example embodiment)

A fifth example embodiment will be described below with reference to FIGS. 5A to 5C. Hereinafter, this example embodiment will be described focusing on the differences between this example embodiment and the first to third example embodiments, and the repeated description will be omitted. FIG. 5A is a plan view of a package structure including an EBG structure. FIG. 5B is a cross-sectional view taken along the line X7-X8 of FIG. 5A. FIG. 5C is a cross-sectional view taken along the line Y3-Y4 of FIG. 5A.

FIGS. 5A to 5C show a package structure 10 including the EBG structure 1.

The package structure 10 includes a package substrate 11 on which the EBG structure 1 is formed, and a circuit substrate 12 flip-chip mounted thereon.

The package substrate 11 is composed of the dielectric substrate 3. The package substrate 11 includes the dielectric substrate 3, the conductor layer 4 formed on the lower surface 3a of the dielectric substrate 3, and a conductor layer 13 (a third conductor layer) formed on the upper surface 3b of the dielectric substrate 3. An opening 14 (a first opening) is formed in a part of the conductor layer 13 where the conductor layer 13 faces a circuit surface of the circuit substrate 12. The EBG structure 1 is formed in the opening 14. In the plan view of FIG. 5A, the EBG structure 1 is disposed inside the opening 14. In the plan view of FIG. 5A, the EBG structure 1 is arranged so as not to overlap the conductor layer 13.

A coplanar line 17a composed of a ground conductor 15a, a ground conductor 15b, and a signal conductor 16a, and a coplanar line 17b composed of a ground conductor 15c, a ground conductor 15d and a signal conductor 16b are formed on input/output parts of the package substrate 11, respectively.

A plurality of via holes 18 for electrically connecting the conductor layer 4 to the conductor layer 13 are formed on both sides of the coplanar line 17a and the coplanar line 17b in the Y direction in the plan view. The via holes 18 are for preventing signal leakage to a parallel plate composed of the conductor layer 4 and the conductor layer 13.

The plurality of via holes 18 are formed at a predetermined pitch in the longitudinal direction of the coplanar line 17a on one side in the Y direction of the coplanar line 17a in the plan view. Similarly, the plurality of via holes 18 are formed at a predetermined pitch in the longitudinal direction of the coplanar line 17a on the other side in the Y direction of the coplanar line 17a in the plan view.

Similarly, the plurality of via holes 18 are formed at a predetermined pitch in the longitudinal direction of the coplanar line 17b on one side in the Y direction of the coplanar line 17b in the plan view. Similarly, the plurality of via holes 18 are formed at a predetermined pitch in the longitudinal direction of the coplanar line 17b on the other side in the Y direction of the coplanar line 17b in the plan view.

A plurality of via holes 19 are formed on an outer peripheral side of the EBG structure 1 in the plan view. The plurality of via holes 19 are formed in order to prevent signal leakage to the parallel plate composed of the conductor layer 4 and the conductor layer 13, and to prevent deterioration of the isolation due to a parasitic path in the parallel plate. Each via hole 19 electrically connects the conductor layer 4 to the conductor layer 13. The plurality of via holes 19 are arranged along an outer peripheral edge of the opening 14 in the plan view to surround the opening 14 in the plan view.

The circuit substrate 12 includes a dielectric substrate 20 and a conductor layer 21 formed on a lower surface of the dielectric substrate 20.

A coplanar line 24a and a coplanar line 24b are formed on input/output parts of the circuit substrate 12. The coplanar line 24a includes a ground conductor 22a, a ground conductor 22b, and a signal conductor 23a. The coplanar line 24b includes a ground conductor 22c, a ground conductor 22d, and a signal conductor 23b.

The coplanar line 24a on the input side is connected to the coplanar line 17a with a ground bump 25a, a ground bump 25b, and a signal bump 26a interposed therebetween. Similarly, the coplanar line 24b on the output side is connected to the coplanar line 17b with a ground bump 25c, a ground bump 25d, and a signal bump 26b interposed therebetween.

A signal input to the coplanar line 24a on the circuit substrate 12 is amplified and subjected to other processing by a circuit 27 (the circuit surface) such as an amplifier and then output via the coplanar line 24b. The conductor layer 21 of the circuit substrate 12 is connected to the conductor layer 13 of the package substrate 11 with a plurality of bumps 28 for electrical ground reinforcement and the like interposed therebetween.

If the EBG structure 1 and the opening 14 are absent, the conductor layer 13 of the package substrate 11 and the conductor layer 21 of the circuit substrate 12 constitute a parallel plate. However, it is assumed that the conductor layer 13 and the conductor layer 4 are electrically connected to each other by the via holes 19 so that signals do not propagate through the parallel plate composed of the conductor layer 13 and the conductor layer 4. In this case, since a parallel plate mode may be present in the parallel plate composed of the conductor layer 13 and the conductor layer 21, there is a possibility that a signal may be coupled to the parallel plate mode by, for example, a bump connection parts between the coplanar line 17a and the coplanar line 24a, or a discontinuous part in the circuit 27. As a result, it can be considered that a signal may propagate through the parallel plate which is not an original signal path, thereby deteriorating the isolation between the input and output of the circuit substrate 12. The same applies to the parallel plate composed of the conductor layer 4 and the conductor layer 21, which is formed when only the EBG structure 1 is absent.

On the other hand, in this example embodiment, the EBG structure 1 similar to that according to the first to third example embodiments is formed in a region of the package substrate 11 facing the circuit substrate 12. An upper surface of the EBG structure 1 has a high impedance in the vicinity of the resonance frequency of the resonator 2. Therefore, if a thickness $T_2$ of a gap 29 between the EBG structure 1 and the conductor layer 21 is ¼ or less of the wavelength in the vacuum, the electromagnetic wave cannot propagate through the gap 29. When the gap is filled with a dielectric material such as an underfill material, the thickness $T_2$ must be $1/(4\sqrt{(\varepsilon_r)})$ ($\varepsilon_r$ is a relative permittivity of the dielectric material) or less. Since the thickness $T_2$ of the gap 29 is about the height of the bump 28, and is commonly about several tens of micrometers, the above condition is usually satisfied. As a result, deterioration of the isolation due to a parasitic path between the package substrate 11 and the circuit substrate 12 can be prevented or reduced.

By forming the groove structure 7 on the lower surface of the package substrate 11, the frequency at which the EBG structure 1 functions can be increased without reducing the thickness of the entire dielectric substrate 3.

A microstrip line composed of a signal conductor formed on the conductor layer 13 and the conductor layer 4 may be used as a transmission line on the package substrate 11.

Sixth Example Embodiment

Figure 6A:
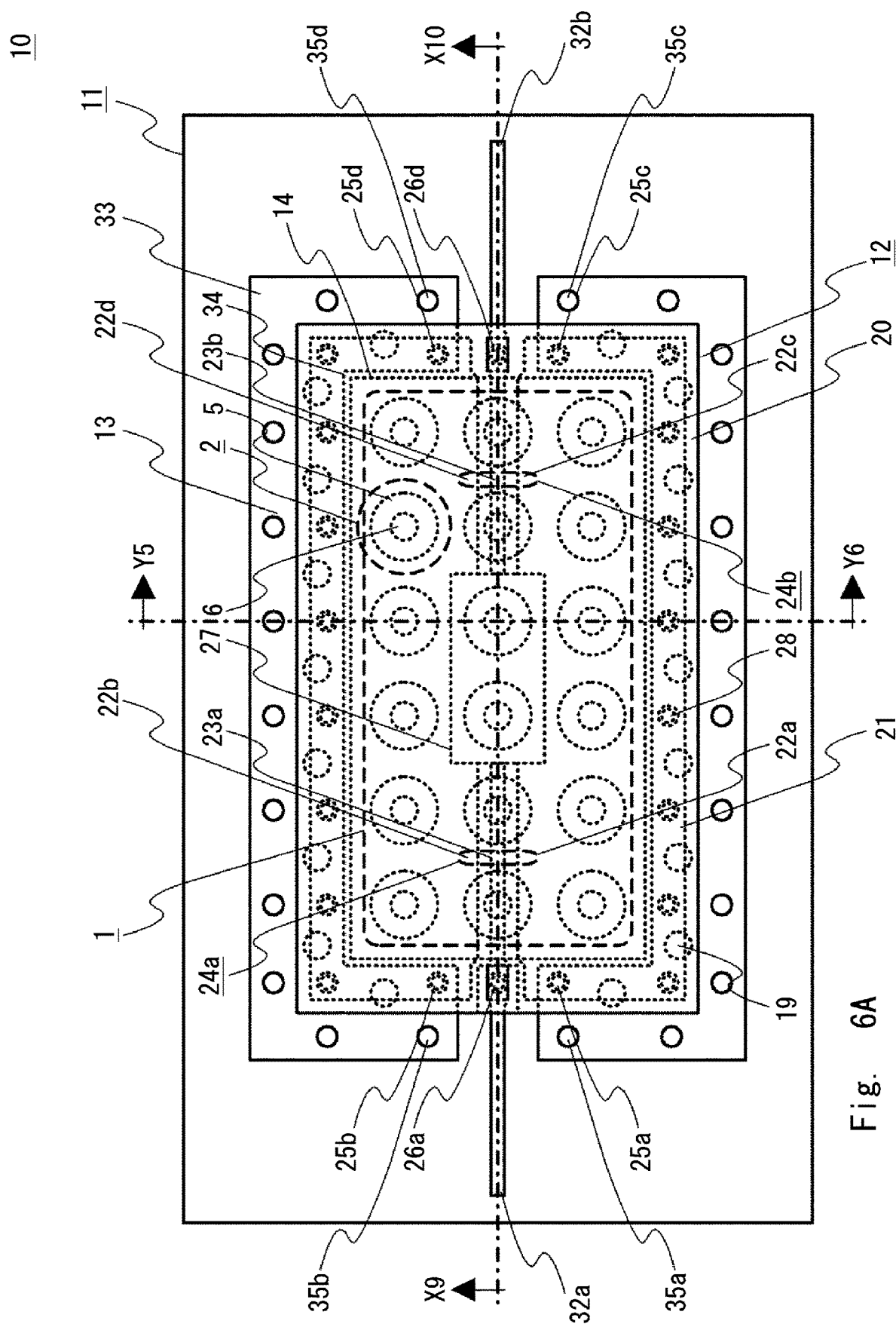
FIG. 6A is a plan view of a package structure having an EBG structure (sixth example embodiment)
Figure 6B:
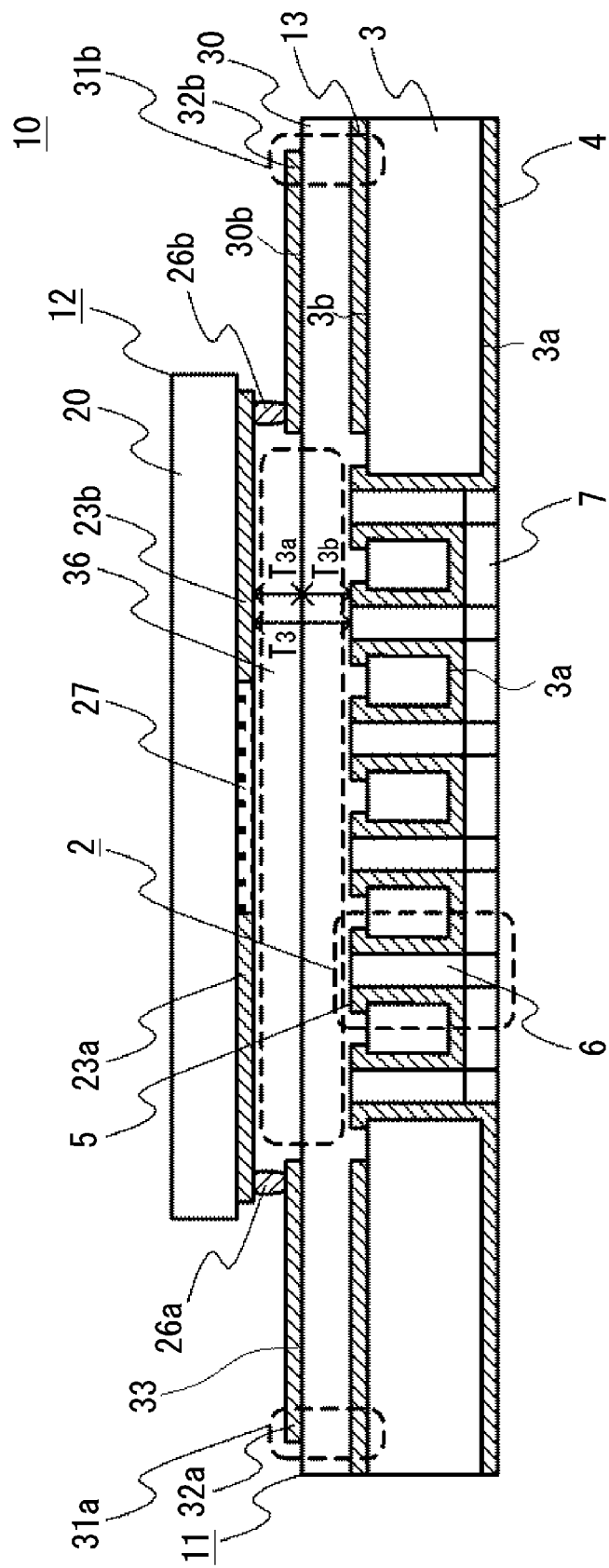
FIG. 6B is a cross-sectional view taken along the line X9-X10 of FIG. 6A (sixth example embodiment)
Figure 6C:
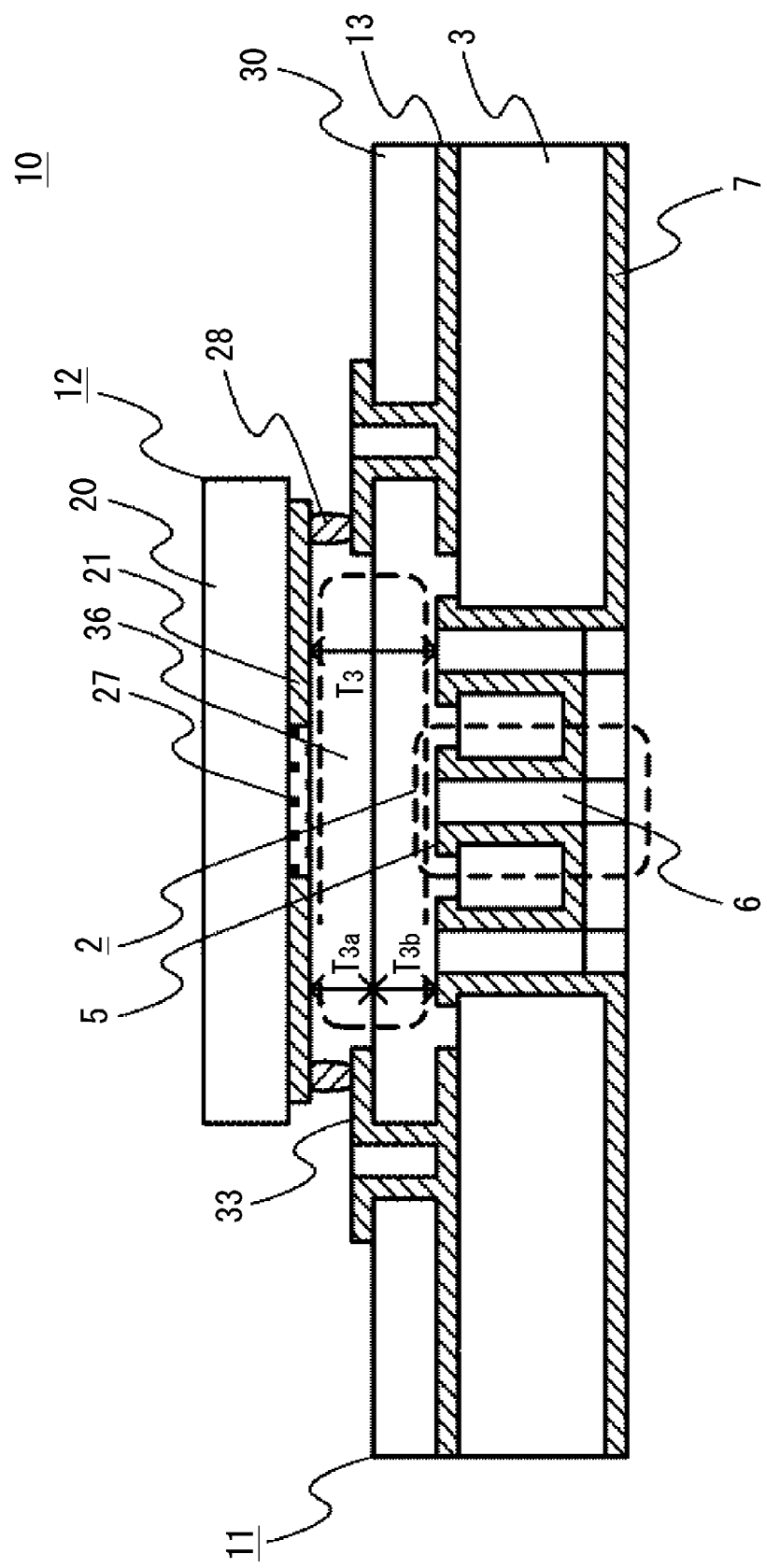
FIG. 6C is a cross-sectional view taken along the line Y5-Y6 of FIG. 6A (sixth example embodiment)
Figure 7:
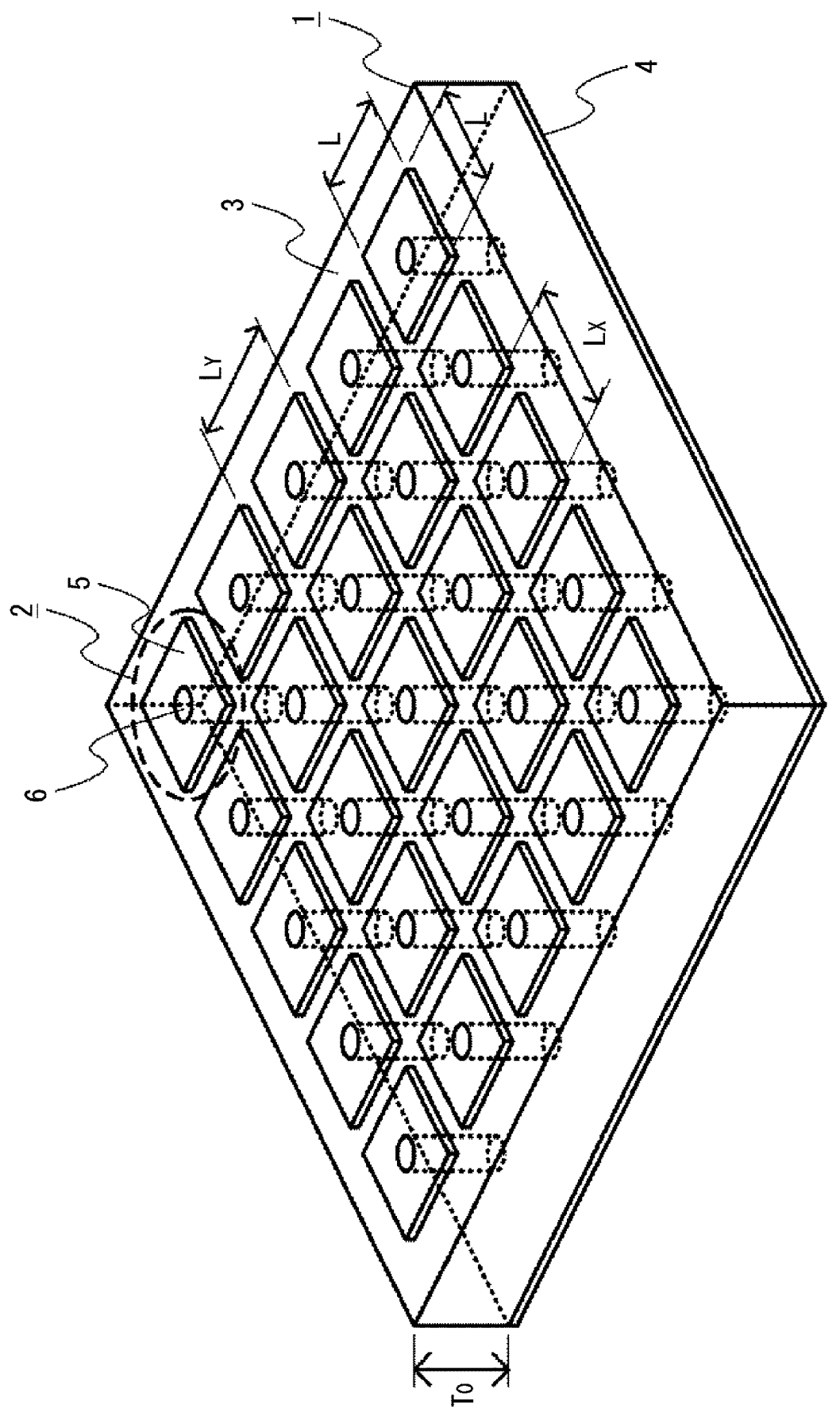
FIG. 7 is an EBG structure diagram according to related art.

Next, a sixth example embodiment will be described with reference to FIGS. 6A to 6C. Hereinafter, this example embodiment will be described focusing on the differences between this example embodiment and the fifth example embodiment, and repeated description will be omitted. FIG. 6A is a plan view of a package structure including an EBG structure. FIG. 6B is a cross-sectional view taken along the line X9-X10 of FIG. 6A. FIG. 6C is a cross-sectional view taken along the line Y5-Y6 of FIG. 6A.

A difference between the package structure 10 according to this example embodiment and the package structure 10 according to the fifth example embodiment is in the configuration of the package substrate 11. Specifically, in the package substrate 11 according to this example embodiment, a dielectric substrate 30 (a third dielectric substrate) is laminated on the upper surface 3b of the dielectric substrate 3, and a conductor layer 33 (a fourth conductor layer) is formed on an upper surface 30b of the dielectric substrate 30. In the conductor layer 33, a signal conductor 32a and a signal conductor 32b constituting the microstrip line 31a and the microstrip line 31b, respectively, are formed.

An opening 34 (a second opening) having the same size as that of the opening 14 is formed in a part of the conductor layer 33 where the conductor layer 33 faces the circuit surface of the circuit substrate 12. In a manner similar to the fifth example embodiment, the EBG structure 1 is formed in the opening 14. In the plan view of FIG. 6A, the EBG structure 1 is disposed inside the opening 34. In the plan view of FIG. 6A, the EBG structure 1 is arranged so as not to overlap the conductor layer 33.

The microstrip line 31a, which is composed of the signal conductor 32a and the conductor layer 13 serving as a ground conductor, and the microstrip line 31b, which is composed of the signal conductor 32b and the conductor layer 13, are formed on the input/output parts of the package substrate 11, respectively. The conductor layer 13 constituting the ground conductors of the microstrip line 31a and the microstrip line 31b is electrically connected to the conductor layer 33 by via holes 35a to 35d in the vicinity of the input/output parts of the circuit substrate 12. In this way, the microstrip line 31a and the microstrip line 31b as input/output of the package substrate 11 are connected to the coplanar line 24a and the coplanar line 24b as input/output of the circuit substrate 12 with the following components interposed therebetween. Specifically, the components are the signal bump 26a (bump), the signal bump 26b, and the ground bumps 25a to 25d. In addition, the conductor layer 21 of the circuit substrate 12 is connected to the conductor layer 33 of the package substrate 11 with the bumps 28 as appropriate for electrical ground reinforcement and the like interposed therebetween.

In a manner similar to the fifth example embodiment, the upper surface of the EBG structure 1 has a high impedance in the vicinity of the resonance frequency of the resonator 2. Thus, if a thickness $T_3$ of a gap 36 between the upper surface of the EBG structure 1 and the conductor layer 21 is $1/(4\sqrt{(\varepsilon_{reff})})$ ($\varepsilon_{reff}$ is an effective relative permittivity of the gap 36) or less of the wavelength in vacuum, the electromagnetic wave cannot propagate through the gap 36. The effective relative permittivity $\varepsilon_{reff}$ depends on a thickness $T_{3a}$ of an air layer between the dielectric substrate 30 and the conductor layer 21 and the relative permittivity and a thickness $T_{3b}$ of the dielectric substrate 30. When the air layer is filled with a dielectric material such as an underfill material, the effective relative permittivity $\varepsilon_{reff}$ also depends on the dielectric constant of the dielectric material. The thickness of the dielectric substrate 30 is set so that the thickness $T_3$ of the gap 36 satisfies the above condition. As a result, deterioration of the isolation due to a parasitic path between the package substrate 11 and the circuit substrate 12 can be prevented or reduced.

By forming the groove structure 7 on the lower surface of the package substrate 11, the frequency at which the EBG structure 1 functions can be increased without reducing the thickness of the entire dielectric substrate 3.

In this example embodiment, since the flexibility in design is high in regard to the thickness $T_{3b}$ of the dielectric substrate 30, when a microstrip line is used as an input/output transmission line of the package substrate 11, the following effects are exhibited. Specifically, the widths of the signal line 32a and the signal line 32b of the microstrip lines can be made as large as the width of the transmission line on the circuit substrate 12. Therefore, it is possible to prevent or reduce a sudden change in the signal electromagnetic field at the bump connection parts between the microstrip line 31a and the microstrip line 31b and the coplanar line 24a and the coplanar line 24b. It is thus possible to improve the reflection characteristics at the connection parts.

Although the microstrip line is used as the transmission line on the package substrate 11, a coplanar line may be used.

The material of the dielectric substrate 30 can be a quartz glass. However, since the quartz glass is rigid and fragile, if the material of the dielectric substrate 30 is a quartz glass, lamination of the dielectric substrate 30 becomes difficult. Therefore, as the material of the dielectric substrate 30, it is preferable to use a resin material having a low rigidity and a small load on the quartz glass substrate, such as polyimide. In this case, the dielectric substrate 30 made of a sheet-like resin material may be bonded to the conductor layer 13.

In the above example embodiments, the pitches $L_X$ and $L_Y$ of the long holes in the X direction and the Y direction are fixed, but may be changed as appropriate. The length, width, and depth of the plurality of long holes may be varied as appropriate. An example of the configuration in which the conductor layer is provided only on the inner wall surface of the via hole and the groove structure. Alternatively, the inside of the groove structure may be filled with a conductor or a dielectric material.

In each of the above example embodiments, although the quartz glass substrate is used as the dielectric substrate 3, other dielectric substrates such as a ceramic substrate and a resin substrate may be used.

The groove structure 7 can be implemented by forming a long hole by, for example, router processing.

In the fifth and sixth example embodiments, although the transmission line on the circuit substrate is the coplanar line, it may be a microstrip line. In this case, for example, in an IC manufactured by Si semiconductor processing, the microstrip line desirably has such a structure that the electromagnetic field is locally present in a thin dielectric layer, such as a microstrip line formed by laminating a thin dielectric layer on an Si substrate and providing a wiring layer. This is because the discontinuity in the path of the ground current on the package substrate can be reduced, and the change in the circuit characteristics due to the influence of the surface of the package substrate facing the circuit substrate can be reduced.

Further, a conductor layer may be provided on the surface of the circuit substrate opposite to the surface on which the transmission line is formed. In this case, it is desirable to provide via holes for electrically connecting the upper and lower conductor layers of the circuit substrate to each other in order to prevent or reduce signals propagating through the parallel plate composed of the upper and lower conductor layers.

Depending on the module configuration, the package substrate and the circuit substrate may include wiring such as DC wiring, baseband signal wiring, intermediate frequency signal wiring, additional radio frequency signal wiring, and bump connection as appropriate.

Although the present disclosure has been described with reference to the example embodiments, the present disclosure is not limited to the above. The configuration and details of the present disclosure can be modified in various ways that will be understood by those skilled in the art within the scope of the invention.

This application claims priority on the basis of Japanese Patent Application No. 2019-013160, filed Jan. 29, 2019, the entire disclosure of which is incorporated herein by reference.

INDUSTRIAL APPLICABILITY

The present disclosure can be applied to electromagnetic bandgap structures.

REFERENCE SIGNS LIST

1 EBG STRUCTURE
2 RESONATOR
3, 8, 20, 30 DIELECTRIC SUBSTRATE
4, 9, 13, 21, 33, 50 CONDUCTOR LAYER
5 PATCH CONDUCTOR
6, 18, 19, 35a TO 35d VIA HOLE
7 GROOVE STRUCTURE
7a TO 7c LONG HOLE
10 PACKAGE STRUCTURE
11 PACKAGE SUBSTRATE
12 CIRCUIT SUBSTRATE
14, 34 OPENING
15a TO 15d, 22a TO 22d GROUND CONDUCTOR
16a, 16b, 23a, 23b, 32a, 32b SIGNAL CONDUCTOR
17a, 17b, 24a, 24b COPLANAR LINE
25a TO 25d, 26a, 26b, 28 BUMP
27 CIRCUIT
29, 36 GAP
31a, 31b MICROSTRIP LINE
51 CONDUCTOR SURFACE

What is claimed is:

1. An electromagnetic bandgap structure comprising a plurality of resonators, wherein
the resonator comprises:
a first dielectric substrate;
a patch conductor formed on an upper surface of the first dielectric substrate; and
a first conductor layer formed on a lower surface of the first dielectric substrate;
the resonator is configured in such a way that the patch conductor and the first conductor layer are electrically connected to each other by via holes penetrating the first dielectric substrate;
a plurality of long holes not penetrating the first dielectric substrate are formed on the lower surface of the first dielectric substrate;
a long hole conductor layer is formed on an inner wall surface of the plurality of long holes,
the first conductor layer and the long hole conductor layer are electrically connected to each other to thereby form an integral conductor surface, and
the via holes are electrically connected to the conductor surface in the long holes.

2. The electromagnetic bandgap structure according to claim 1, wherein
a distance between two adjacent resonators among the plurality of resonators is ½ or less of a wavelength of a surface wave propagating in a structure composed of the first dielectric substrate and the first conductor layer.

3. The electromagnetic bandgap structure according to claim 1, wherein
the plurality of long holes are formed so as to cross each other into a lattice shape.

4. The electromagnetic bandgap structure according to claim 1, wherein
a second dielectric substrate is laminated on the lower surface of the first dielectric substrate, and
a second conductor layer is formed on a lower surface of the second dielectric substrate.

5. The electromagnetic bandgap structure according to claim 4, wherein
a microstrip line is formed of the first conductor layer and the second conductor layer.

6. The electromagnetic bandgap structure according to claim 4, wherein
a coplanar line is formed of the second conductor layer.

7. The electromagnetic bandgap structure according to claim 1, wherein
the first dielectric substrate is formed of a quartz glass.

8. A package structure formed by flip-chip mounting a circuit substrate on a package substrate, wherein
the package substrate is composed of the first dielectric substrate,
a third conductor layer is formed on the upper surface of the first dielectric substrate,
a first opening is provided in a part of the third conductor layer where the third conductor layer faces a circuit surface of the circuit substrate, and
the electromagnetic bandgap structure according to claim 1 is formed in the first opening.

9. The package structure according to claim 8, wherein
a third dielectric substrate is laminated on the upper surface of the package substrate,
a fourth conductor layer is formed on an upper surface of the third dielectric substrate, and
a second opening is provided in a part of the fourth conductor layer where the fourth conductor faces the circuit surface of the circuit substrate.

10. The package structure according to claim 9, wherein
a signal conductor is formed on the fourth conductor layer, and
a microstrip line composed of the signal conductor and the third conductor layer is connected by a transmission line and a bump of the circuit substrate.

* * * * *